(12) United States Patent
Renforth et al.

(10) Patent No.: US 9,581,632 B2
(45) Date of Patent: Feb. 28, 2017

(54) APPARATUS AND METHOD FOR REMOTE MONITORING OF PARTIAL DISCHARGE IN ELECTRICAL APPARATUS

(71) Applicants: Lee Renforth, Manchester (GB); Steven Goodfellow, Manchester (GB); Malcolm Seltzer-Grant, Manchester (GB); Ross Mackinlay, Manchester (GB)

(72) Inventors: Lee Renforth, Manchester (GB); Steven Goodfellow, Manchester (GB); Malcolm Seltzer-Grant, Manchester (GB); Ross Mackinlay, Manchester (GB)

(73) Assignee: High Voltage Partial Discharge Limited, Manchester (GB)

( * ) Notice: Subject to any disclaimer, the term of this patent is extended or adjusted under 35 U.S.C. 154(b) by 242 days.

(21) Appl. No.: 14/345,307

(22) PCT Filed: Sep. 17, 2012

(86) PCT No.: PCT/GB2012/052290
§ 371 (c)(1),
(2) Date: Mar. 17, 2014

(87) PCT Pub. No.: WO2013/038210
PCT Pub. Date: Mar. 21, 2013

(65) Prior Publication Data
US 2014/0320139 A1    Oct. 30, 2014

(30) Foreign Application Priority Data

Sep. 16, 2011   (GB) .................................. 1116088.4
Apr. 16, 2012   (GB) .................................. 1206645.2

(51) Int. Cl.
*G01R 31/02*    (2006.01)
*G01R 31/11*    (2006.01)
(Continued)

(52) U.S. Cl.
CPC ............ *G01R 31/025* (2013.01); *G01R 31/11* (2013.01); *G01R 31/1263* (2013.01); *G01R 31/3275* (2013.01); *G01R 31/34* (2013.01)

(58) Field of Classification Search
CPC .............. G01R 31/327; G01R 31/3275; G01R 31/3277; G01R 31/3278; G01R 31/3274; H01H 47/002
(Continued)

(56) References Cited

U.S. PATENT DOCUMENTS 5,933,012 A * 8/1999 Bengtsson ........... G01R 15/181
324/524
7,165,014 B2 * 1/2007 Kaneda ................ G01R 31/343
324/765.01
(Continued)

FOREIGN PATENT DOCUMENTS

| JP | 2003271234 A | * | 9/2003 |
| JP | 2005189226 A | * | 7/2005 |
| JP | 2007232495 A | * | 9/2007 |

OTHER PUBLICATIONS

Pauls. Hamer; Petroleum Industry; J. Webster (ed.), Wiley Encyclopedia of Electrical and Electronics Engineering. Copyright© 1999 John Wiley & Sons, Inc. Chevron Research and Technology Company.*
(Continued)

*Primary Examiner* — Jermele M Hollington
*Assistant Examiner* — Christopher McAndrew
(74) *Attorney, Agent, or Firm* — Leydig, Voit & Mayer, LTD

(57) ABSTRACT

Apparatus for remote monitoring of partial discharge events in electrical apparatus 1 includes one or more sensors 5 for (Continued)

detecting partial discharge pulses in one or more conductors 2 conveying electrical power to the apparatus. A programmed computer 5 analyzes measured pulses and discriminates between those originating from the apparatus being monitored and elsewhere. Discrimination is achieved by analyzing pulse shape, and by comparing pulses to partial discharge events measured locally to the sensors. The apparatus enables partial discharge events in electrical apparatus to be monitored without having to install sensors at the equipment itself.

29 Claims, 5 Drawing Sheets

(51) Int. Cl.
    *G01R 31/12*     (2006.01)
    *G01R 31/327*     (2006.01)
    *G01R 31/34*     (2006.01)

(58) Field of Classification Search
    USPC .......................................................... 324/415
    See application file for complete search history.

(56) References Cited

U.S. PATENT DOCUMENTS

| | | | |
|---|---|---|---|
| 2005/0012507 A1* | 1/2005 | Kaneda | G01R 31/343 324/536 |
| 2007/0139056 A1* | 6/2007 | Kaneiwa | G01R 31/1227 324/536 |
| 2009/0119035 A1* | 5/2009 | Younsi | G01R 31/343 702/58 |
| 2010/0114509 A1* | 5/2010 | Montanari | G01R 31/1272 702/58 |
| 2010/0241372 A1* | 9/2010 | Xu | G01R 31/1227 702/58 |

OTHER PUBLICATIONS

World Intellecutal Property Organization, Search Report in United Kingdom Patent Application No. PCT/GB2012/052290 (Feb. 15, 2013).

Shaozhen, Qin et al., "The Study of PD Propagation Phenomenon in Power Network," IEEE Transactions on Power Delivery, vol. 21, No. 3, Jul. 2006, pp. 1038-1091.

Stone, Greg, C. et al., "Objective Methods to Interpret Partial-Discharge Data on Rotating-Machine Stator Windings," IEEE Transactions on Industry Applications vol. 42, No. 1, Jan./Feb. 2006, pp. 195-200.

* cited by examiner

PHASE TO EARTH

PHASE TO PHASE

APPARATUS AND METHOD FOR REMOTE MONITORING OF PARTIAL DISCHARGE IN ELECTRICAL APPARATUS

TECHNICAL FIELD OF THE INVENTION

The present invention relates to an apparatus and method for remote monitoring of partial discharge in electrical apparatus. The invention also relates to an installation including such apparatus.

BACKGROUND TO THE INVENTION

Partial discharge is caused by the localised electrical breakdown of electric insulation materials under high voltage stress. Detecting and measuring partial discharge events is a useful way of identifying underlying electrical breakdown and other incipient faults in electrical apparatus.

Existing methods of detecting partial discharge events involve the use of sensors on the apparatus being monitored to detect electrical pulses caused by a partial discharge event. Suitable sensors include coupling capacitors and inductive high frequency high current transformers. Transient earth voltage detectors have been employed to sense the electromagnetic field at gaps in the metal enclosures of switchgear so as to detect partial discharge events in the switchgear.

In each case the sensor must be placed near to the apparatus being monitored so as to detect discharge events originating from the apparatus.

Often electrical machines operate in remote and dangerous environments. An example is in oil and gas installations where electric motors used to drive pumps and compressors are located a considerable distance from switchgear that controls the motor, and may be located in an explosion risk environment. Monitoring electrical apparatus at multiple remote locations involves installing suitable sensors on each item of apparatus and arranging for the sensor outputs to be relayed to a convenient monitoring point. Where the apparatus is in an explosive risk environment it is subject to strict safety criteria and any associated monitoring equipment must also meet that criteria. These requirements are onerous and consequently monitoring of electrical apparatus located in explosive risk environments for partial discharge is often omitted.

It is an object of embodiments of the present invention to address these issues.

SUMMARY OF THE INVENTION

According to an aspect of the present invention there is provided apparatus for remote monitoring of partial discharge events in electrical apparatus comprising one or more sensors for detecting partial discharge pulses in one or more conductors conveying electrical power to the apparatus and means for discriminating arranged to analyse pulse shape and to discriminate between detected pulses according to pulse shape in order to determine whether detected partial discharge pulses originated from the apparatus being monitored or from other causes.

According to another aspect of the present invention there is provided a method of monitoring partial discharge events in electrical apparatus, the method comprising the steps of mounting one or more sensors for detecting partial discharge pulses in a conductor supplying electrical power to the apparatus at a position remote from the apparatus; detecting partial discharge pulses; and analysing the shape of detected pulses in order to discriminate between partial discharge pulses originating from the apparatus and pulses originating from other causes.

Thus, the invention enables partial discharge events in electrical apparatus to be monitored remotely and without having to connect sensors to the apparatus itself. It is therefore possible, with certain embodiments, for several different pieces of electrical apparatus to be monitored from a single location, typically switchgear, from which power is distributed to the apparatus.

The or each sensor may be capable of detecting pulses with frequencies of less than 1 MHz and in one embodiment in the range 100 kHz-100 MHz.

The means for discriminating may comprise a digitiser arranged to receive from the or each sensor on a separate channel and to digitise the data into data blocks spanning the duration of at least one cycle of alternating current supplied to the apparatus in the or each electrical conductor, and comprising data from the or each channel over that duration. The means for discriminating may be arranged to scan each data block to detect partial discharge pulses, and to store a data segment comprising the output of each channel for each detected partial discharge event, the duration of the data segment being chosen so that it is short enough that only the detected partial discharge pulse is included in the channel on which the pulse was detected.

The duration of the data segment may be chosen to be at least the time taken for a pulse to propagate along the or each conductor between the sensor(s) and the apparatus being monitored, and back. This ensures that any first reflection of the pulse is also captured within the segment, and will not therefore be captured in a separate segment and treated as a different event. Subsequent reflections of the same pulse will be of significantly reduced magnitude and so unlikely to trigger capture of a segment and/or can be ignored by the means for discriminating by predicting the time at which subsequent reflections will arrive.

The apparatus may comprise one or more additional partial discharge sensors intended to detect partial discharge events which do not originate from the apparatus being monitored. These one or more additional partial discharge sensors may be arranged only to detect partial discharge events which do not originate from the apparatus being monitored. By comparing the output of the or each additional sensors with those arranged to detect partial discharge pulses in the conductor(s) it is possible to identify detected pulses in the conductor(s) which did not originate in the apparatus being monitored. The one or more additional sensors may comprise a transient earth voltage sensor. In this case the means for discriminating may be arranged to compare the output of the or each sensor for detecting partial discharge pulses in one or more conductors conveying electrical power to the apparatus and the transient earth voltage sensor thereby to determine if detected discharge pulses originate from the apparatus being monitored or from other causes. In particular, the means for discriminating may compare the time at which events are detected by each sensor. Where a pulse is detected in a conductor at substantially the same time as a discharge event is detected by a transient earth voltage sensor the event may be classified as local to the transient earth voltage sensor.

The apparatus may comprise two or more sensors for detecting partial discharge pulses in two or more conductors conveying electrical power to the apparatus being monitored and means for comparing measurements made by the sensors thereby to determine the cause of a detected partial discharge event. The means for discriminating may be arranged to compare measurements made by each sensor thereby to determine the cause of a measured partial discharge event. The means for discriminating may classify the cause of a partial discharge event as phase to phase when an event is measured simultaneously by two or more sensors and phase to earth when the event is measured only by a single sensor or when one sensor measures the event with significantly greater magnitude than the other sensor or sensors.

The means for discriminating may measure any one, some or all of: rise time, fall time, pulse width, frequency content, magnitude, polarity and number of oscillations. Measurement of fall time has been found to be particularly useful as this parameter tends to experience the greatest change as a pulse propagates along a conductor.

The apparatus may further comprise means to measure charge content of detected pulses, and means for applying a pulse retention factor to measured charge content in order to determine an approximate value for charge content of the pulse at the apparatus being monitored, rather than at the point of measurement. The pulse retention factor could be determined empirically for a particular installation. Alternatively, the pulse retention factor could be derived by specifying characteristics of the conductors along which pulses are received. This could include length and/or type of cable and/or the type of cable insulation employed such as XLPW, paper, EPR and PVC.

The apparatus may further comprise means to measure any one, some or all of the following characteristics of detected pulses: absolute peak, average peak, average partial discharge and cumulative partial discharge activity. An appropriate pulse retention factor could also be applied to any one, some or all of these values, and this factor could also be dependent upon characteristics of the conductor.

The means for discriminating may also be arranged to detect reflected pulses and to measure the time elapsed between detection of a first pulse and a subsequent reflection of the first pulse. Pulses travelling along the conductor will tend to be reflected back along the conductor from one end to another. For a given conductor a return time can be measured or calculated. This is the time taken for a pulse to travel from one end of the conductor to the other and back. The means for discriminating may be arranged to determine if the time elapsed between detection of an initial and reflected pulse is less than, or substantially the same as, the return time. In the former case it can be concluded that the pulse originated from a partial discharge event occurring somewhere along the length of the conductor and in the latter that the pulse originated from a partial discharge event in the apparatus being monitored, or at least at one end of the conductor.

Where the output of the or each sensors is stored in data segments with a duration less than the time taken for a pulse to propagate along the or each conductor between the sensors(s) and the apparatus being monitored and back, the means for discriminating may arranged to scan each data segment to identify any reflected pulses contained in the segment and to classify any detected pulse for which a corresponding reflected pulse has been identified in the same segment as not having occurred in the apparatus being monitored. Since, with this arrangement any reflected pulse from a pulse arising in the apparatus being monitored will not be included in the data segment.

In one embodiment three sensors for detecting pulses are provided, enabling the apparatus to monitor three phases of a three phase power supply.

The apparatus may comprise multiple sets of sensors and a multiplexer arranged to connect individual sets of sensors to the means for discriminating in turn thereby to enable multiple pieces of apparatus to be monitored.

The means for discriminating may be implemented by a programmable computer.

The apparatus may form part of an installation comprising electrical apparatus to be monitored, at least one conductor connected to the apparatus to be monitored for conveying electrical power to the apparatus, the apparatus for remote monitoring being connected to the or each conductor remote from the apparatus to be monitored. The apparatus for monitoring may be mounted at least 50 m from the apparatus to be monitored, but could be mounted at least 100 m or 500 m from the apparatus, or more. The conductor may run from the apparatus being monitored to switchgear, and the apparatus for monitoring may be mounted in or adjacent the switchgear. In this case, where the apparatus for monitoring additionally comprises a transient earth voltage sensor this may be associated with the switchgear.

The or each conductor may be comprised in a cable. There may be three conductors, for conducting a three phase electrical supply. The apparatus may comprise three sensors, a respective sensor monitoring each conductor.

The apparatus being monitored may be an electrical machine, such as a rotating electrical machine and in one example is an electric motor. The installation may comprise a plurality of machines, each connected to three electrical conductors (which could be comprised in a three core cable, or be provided by three single core cables or otherwise) and the apparatus may comprise a respective set of three sensors connected respectively to the three conductors of that apparatus. Each set of sensors may also be connected to a multiplexer arranged to provide the output of each set of sensors, in turn, to the means for discriminating.

The apparatus to be monitored may be located in an explosion risk environment, and the apparatus for monitoring may be located outside the explosion risk environment.

DETAILED DESCRIPTION OF THE INVENTION

In order that the invention may be more clearly understood embodiments thereof will now be described, by way of example only, with reference to the accompanying drawings, of which:

Figure 1:
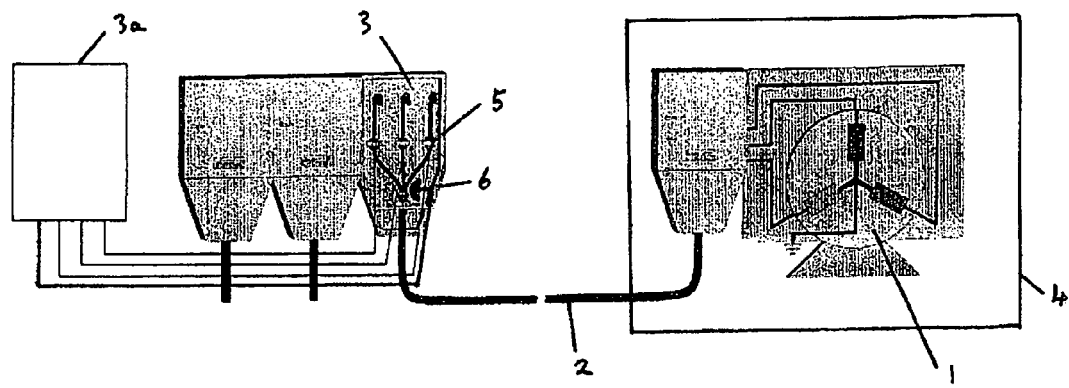
FIG. 1 is a schematic view of an electrical installation.

Referring to the drawings an electrical installation comprises a three phase electric motor 1. The motor 1 is supplied with three phase 6.6 kV electrical power via a three core electrical cable 2 with an earthed sheath. The cable 2 extends some 1000 m from the motor 1 to the switchgear, located in a housing 3, for controlling the supply of electrical current to the motor 1 via the cable 2. The motor 1 is located in an explosion risk (Ex) environment 4. The cable 2 extends out of the Ex environment 4. The switchgear and the housing 3 are not located in an Ex environment.

Figure 2:
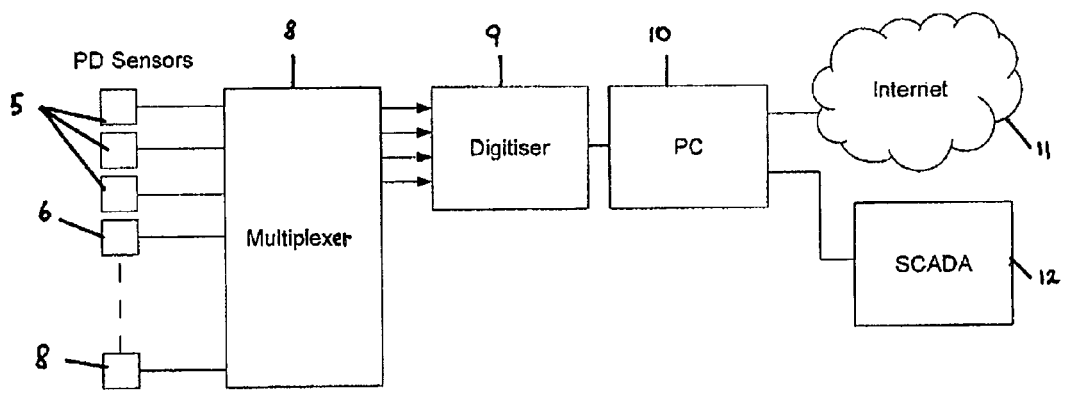
FIG. 2 is a schematic view of the partial discharge monitoring apparatus of the installation of FIG. 1.
Figure 3:
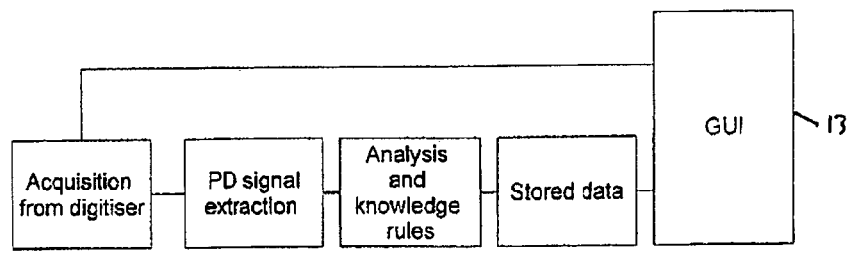
FIG. 3 is a flowchart illustrating operation of the partial discharge monitoring apparatus of FIG. 2.

Apparatus 3a for detecting and measuring partial discharge (partial discharge) events occurring in the motor is provided. This apparatus is shown schematically in FIG. 2. partial discharge events may typically occur in the motor as a result of breakdown of insulating material, or insufficient clearance between conductors, resulting in electrical charge flowing between different phases of the motor's stator windings, or between a phase and earth.

The partial discharge detecting apparatus comprises three wideband high frequency high current (HFCT) transformer sensors 5, mounted in the switchgear housing on respective conductors supplying three phase electrical power to the motor 1. These sensors could alternatively be mounted on the respective conductors outside the switchgear housing. Sensor types HCFT140-100HC and HFCT100-50HC supplied by the applicant are suitable. The partial discharge detecting apparatus additionally comprises a single transient earth voltage (TEV) electrical sensor 6 also located inside the housing 3 with the switchgear. As with the HFCT sensors, the TEV sensor could alternatively be located outside the switchgear housing 3. The remainder of the monitoring apparatus is outside the switchgear housing 3.

Any suitable alternative sensors could be employed, such as HV coupling capacitors.

The four sensors 5, 6 associated with the motor 1 are connected together with any additional sensors 7 to a multiplexer 8. The multiplexer 8 outputs four channels to a four channel wideband digitiser 9 connected in turn to a personal computer 10. The digitiser 9 has a sample rate of at least 100 MS/s and a bandwidth of a least 50 MHz. The computer 10 provides a sample memory of at least 2 MPts/channel. Vertical resolution is at least 8-bit, but preferably 14-bit.

It will be appreciated that to monitor only a single motor the multiplexer is not required. Where a multiplexer is provided, though, this enables multiple sets of further partial discharge sensors 7 for monitoring additional motors or other apparatus (not shown) to be connected in turn to the digitiser and PC to allow all the apparatus to be monitored.

The computer 10 is connected to the internet 11 and is provided with a SCADA (supervisory control and data acquisition) interface 12. The computer could alternatively or additionally be provided with any other suitable network connection or interface.

In operation the multiplexer 8 feeds the output of all four sensors 5, 6 associated with the motor 1 to the digitiser 9. Where another motor or apparatus is to be monitored the multiplexer 8 would feed the output of a selected set of four sensors to the digitiser 9.

The digitiser synchronously digitises data received from all four sensors in 20/16.67 ms blocks (corresponding to one 50/60 Hz power cycle), acquiring many short duration impulsive events, typically 100 ns-10 μs within each block. The blocks could alternatively span multiple power cycles. The computer runs software for data capture from the sensors, and to apply various techniques including digital signal processing techniques such as wave shape analysis, in order to extract and classify data relating to partial discharge events.

The blocks of data for each channel are scanned to identify and capture impulsive events that may be caused by a partial discharge event. Each partial discharge event is recorded in the form of a short data segment of the multi-channel digitised signal. Event capture is triggered by detection, on any channel, of features of the digital signal that are characteristic of a partial discharge pulse. For example, the signal level on each channel may be monitored along with its computed first and second time derivatives, to identify the times at which the signal or its time derivatives change polarity. A suitable combination of peak signal level and/or duration between zero crossings and/or turning points may trigger segment capture.

The multi-channel digitised signal is temporarily stored in memory while retrospectively processing it to detect partial discharge events in 'real time', so each captured data segment may include data preceding the time point at which segment capture was triggered. Therefore the computer is arranged so that each segment begins a specified period before the detected peak of a partial discharge pulse, to ensure that the start of the pulse is captured. This may be around 5 μs before the detected peak, but could be as little as 1 μs.

The duration of each segment is selected to be at least the return time of the cable, the time taken for a pulse to travel along the length of the cable and back again, with the aim of a capturing a partial discharge pulse together with its first reflection on one or more of the channels, each of which should originate from the same partial discharge event. This could be a fixed segment duration around 10 μs or more. This ensures that when a pulse is detected a first time at one end of the cable, reflected back from the other end of the cable and detected a second time having traveled twice the cable length the reflected pulse is captured in the same data segment from the first pulse. This prevents the reflected pulse from triggering capture of another data segment.

The magnitude of subsequent reflections of the same pulse will be reduced as the pulse propagates along the cable and back and these pulses can be ignored either by ignoring pulses with a magnitude below a certain threshold or by predicting their arrival time at the sensors.

Since each partial discharge pulse is extremely short in relation to the 50/60 Hz power cycle, the data captured is sparse in relation to the digitised signal for the whole cycle, even where a large number of partial discharge events occur during each power cycle. This enables the relevant high-resolution, multi-channel pulse data to be stored, transmitted, and processed relatively efficiently.

When a partial discharge event occurs in the motor 1 this causes a high frequency electromagnetic pulse to propagate along the cable 2 to the switchgear and partial discharge detecting apparatus. By detecting and measuring these pulses the partial discharge detecting apparatus is able to detect partial discharge events, and their magnitude, in the motor 1 which is useful in identifying faults or potential faults in the motor allowing remedial action to be taken at an early stage. This limits motor downtime and reduces the risk of a serious failure or other event.

Partial discharge events occurring elsewhere in the electrical circuit, for example in the switchgear or cable 2, will also cause pulses to propagate along the cable and these will also be detected by the pulse sensors 5.

To detect, classify and measure partial discharge events originating in the motor, as opposed to elsewhere in the electrical system, the computer software uses various techniques.

By analysing the output from all four sensors simultaneously and comparing these it is possible to discriminate between pulses caused by partial discharge events in the motor and the switchgear. The HFCT sensors 5 will detect pulses in the three conductors in the cable 2 carrying the three electrical phases. Pulses in the conductors can arise from partial discharge events at any point in the electrical system. The TEV sensor 6 is sensitive only to transient voltages in the switchgear housing 3, which will arise from partial discharge events occurring in the switchgear. Thus, when pulses are detected simultaneously or substantially simultaneously by the TEV sensor 6 and one or more of the HFCT sensors 5 the computer identifies the detected event as one which is local to the switchgear, i.e. as not originating in the motor 1. In this case pulses will be seen in the output of the TEV sensor and one or more of the HFCT sensors at substantially the same time, and thus within the same four channel data segment.

Captured pulses are further analysed to discriminate between those caused by phase to phase and phase to earth partial discharge events. To achieve this, the computer 10 compares the signals measured by the three HFCT sensors 5. With a phase to earth partial discharge event a pulse is normally seen predominantly only on a single phase, being the phase from which the discharge has occurred. With a phase to phase partial discharge event a pulse is seen on two, and sometimes all three, phases with a similar magnitude owing to partial discharge occurring between two or three phases. When pulses occur simultaneously on two or more phases (but are not seen by the TEV sensor 6) the event is categorised as a phase to phase event, and the phases involved identified. Alternatively, an event may only be categorised as a phase to phase event when a pulse is measured simultaneously on two or more sensors and two of the measured pulses have opposite polarity and a similar magnitude. Pulses may be considered to have a similar magnitude when their respective magnitudes are within 20% of each other.

Where a pulse is measured predominantly on only one phase (but not on the TEV sensor 6) it is categorised as a phase to earth event. In practice, a phase to earth event may cause a pulse on more than one phase, but the pulse measured on one phase will be significantly larger than that measured on other phases. Thus, where a pulse is detected on one phase with a magnitude that is at least a factor of ten greater than that of any simultaneous pulse detected on another phase it is categorised as a phase to earth event.

Simultaneous pulses on different channels will all be detected within the same data segment.

Figure 4:
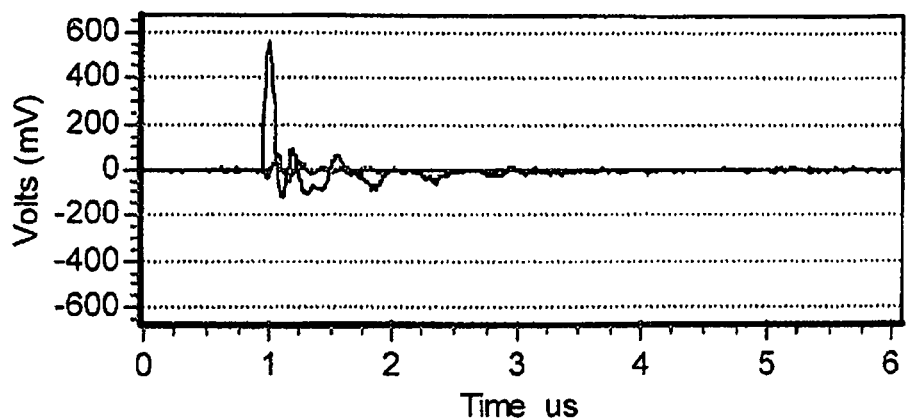
FIG. 4 shows motor generated partial discharge pulses caused by phase to phase and phase to earth partial discharge events.
Figure 4:
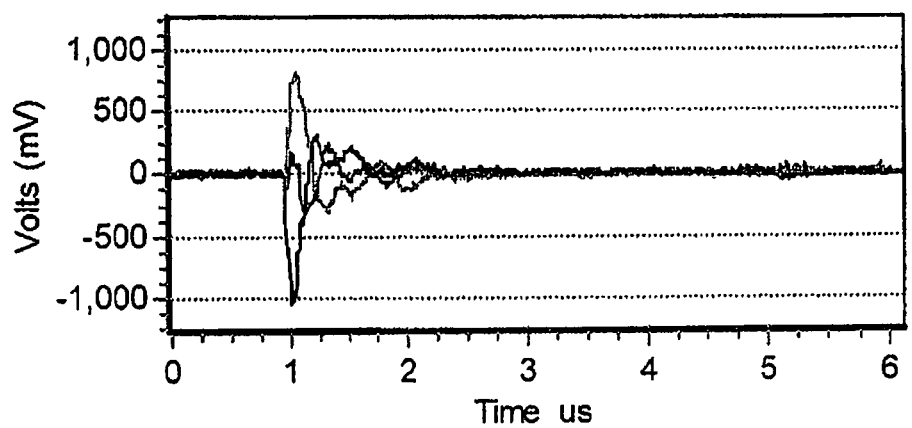

FIG. 4 shows motor generated partial discharge pulses caused by phase to phase and phase to earth partial discharge events.

The pulse wave shape of the detected pulses is then analysed to further discriminate partial discharge pulses originating in the motor from those originating from other sources, such as in the cable and switchgear. Steps may also be taken to discriminate partial discharge pulses from general noise.

Figure 5:
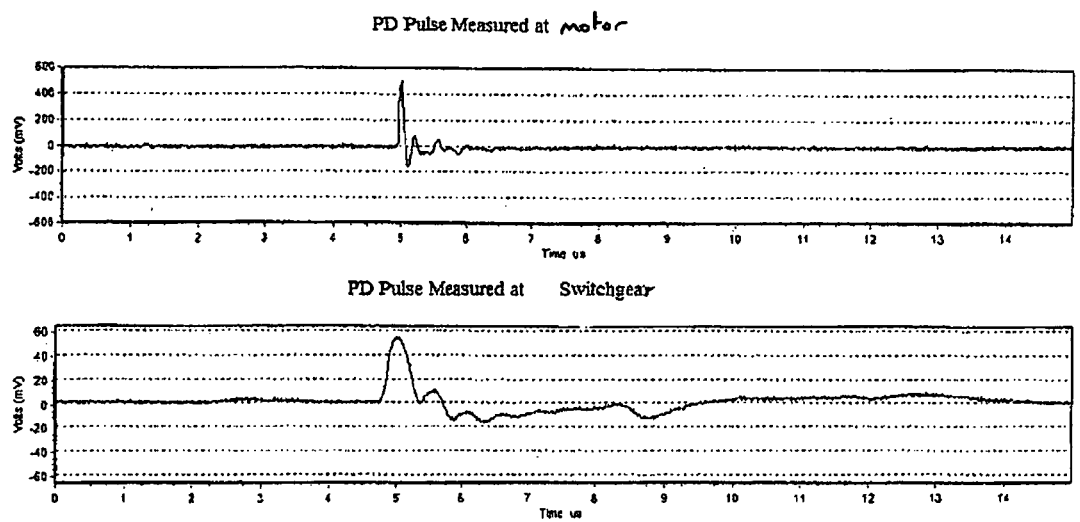
FIG. 5 shows a motor generated partial discharge pulse measured at the motor and at the switchgear of the installation of FIG. 1.

The cable 2 acts as a low pass filter, leading to a change in pulse shape as a pulse propagates from the motor 1 along the cable 2. A pulse is also attenuated as it propagates along the cable. FIG. 5 shows data segments showing a partial discharge pulse measured at the motor (upper graph) and at the same pulse measured at the motor. The pulse measured at the motor has a greater initial peak height, and there are several following oscillations. In contrast the pulse measured at the switchgear essentially comprises a single peak of much reduced height. In effect, higher frequencies have been filtered out and the pulse has begun to adopt a "shark's fin" shape. By recognising pulses with these characteristics the computer is able to distinguish them from pulses originating at the switchgear, and from general noise signals. To characterise pulse shapes the computer 10 calculates some or all of the following parameters: rise time, fall time, pulse width, frequency content, magnitude, polarity and number of oscillations. These parameters can be compared with values stored by the computer 10 and where the parameters fall outside stored ranges the pulse can be classified accordingly and having originated, or not, from the motor 1.

Figure 6:
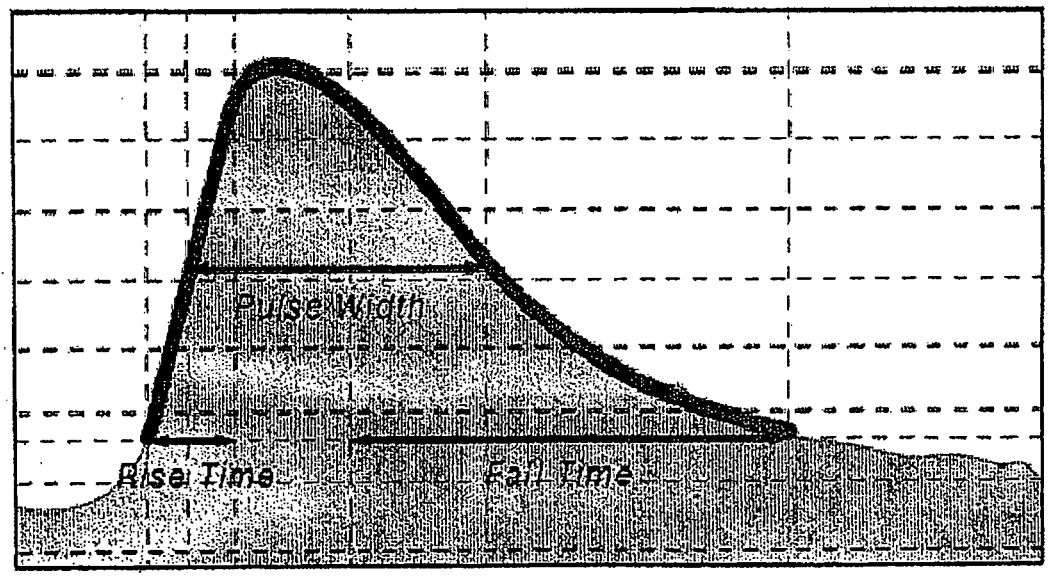
FIG. 6 shows a positive partial discharge pulse.

FIG. 6 shows a typical positive partial discharge pulse, on which measurements of the pulse rise time, fall time and pulse width are shown. In this example the rise time is measured substantially between 10-90% of the height of the rising edge of the pulse, fall time is measured substantially between 90-10% of the height (amplitude) of the falling edge of the pulse and the pulse width is measured between the rising and falling edges at substantially 50% of their height. Alternatively, or in addition, pulse width could be measured between the rising and falling edges at substantially 10% of their height. These measurements, combined with frequency measurement of the dominant frequency of the pulse, may then be used in a knowledge-rule based analysis algorithm for analysis of the pulse shape as the pulse propagates. If the pulse rise time is fast and the peak frequency is in the MHz range the source is deemed to be local to the sensor. If the rise time is slower, in the range of hundreds of nanoseconds, the source is deemed to be the cable or the motor.

For those detected pulses which have been classified as originating from the machine or the cable, the data segment containing the pulse is scanned for reflected pulses, by comparing measured characteristics of pulses captured within the data segment. Pulses travelling along the cable 2 will be reflected at the ends of the cable and propagate back along the cable. For a given length of cable a pulse will take a given length of time to travel from one end of the cable 2 to the other and back, known as the cable return time. For a given length of cable, the return time can be calculated or measured by transmitting a test pulse along the cable from one end and measuring the time which elapses before the reflected pulse is received back from the point of transmission. The computer 10 is arranged to measure the time elapsed between detection of an original pulse and any subsequent pulses which have been identified as reflected pulses in the same data segment. If a reflected pulse is detected after a period of time less than the cable return time (or at least a chosen threshold time less than the cable return time) the pulse is identified as having originated in the cable 2, and thus not from the motor 1.

At this stage, the computer is able to identify those pulses which originated in the motor, which are therefore of interest, as well as classifying their origins as phase to phase or phase to earth events.

It is useful to measure the magnitude of these pulses. However, since pulses are attenuated by the cable, pulse magnitude measured at the switchgear does not correspond to that measured at the machine. The effects of attenuation are compensated for in two ways. Firstly, charge content (the area under the pulse—obtained by integration) rather than peak pulse amplitude is measured. In an example, over a length of cable of approximately 900 m peak pulse amplitude was attenuated by over 80% along the length of the cable whereas charge content of the same pulse was attenuated by less than 20%. So charge content of a pulse is significantly less affected by transmission of the pulse along a cable than peak pulse amplitude. Secondly a pulse retention factor is applied to the measured charge quantity in order to approximate the measured value to what would have been measured at the machine. The appropriate factor can be determined empirically via calibration pulse injection for a given installation. For an installation with 1000 m of XLPE-insulated cable a pulse retention factor of around 0.79 has found to be appropriate. The computer therefore computes a value for charge content of the partial discharge pulse which approximates to the value which would be measured at the machine.

Referring to the example pulse shown in FIG. 6 the charge content q of the travelling wave pulse may be calculated as follows:

$$q = \frac{1}{Z_{Tr}} \int_{t_0}^{t_1} i(t)\,dt \quad \text{(Equation 1)}$$

where $Z_{Tr}$ is the transfer impedance of the HFCT sensor and the limits of integration $t_0$ and $t_1$ define the time of the partial discharge event waveform. The effective charge content of the partial discharge pulse (measured in Coulombs) is effectively the area underneath the partial discharge pulse.

Figure 7:
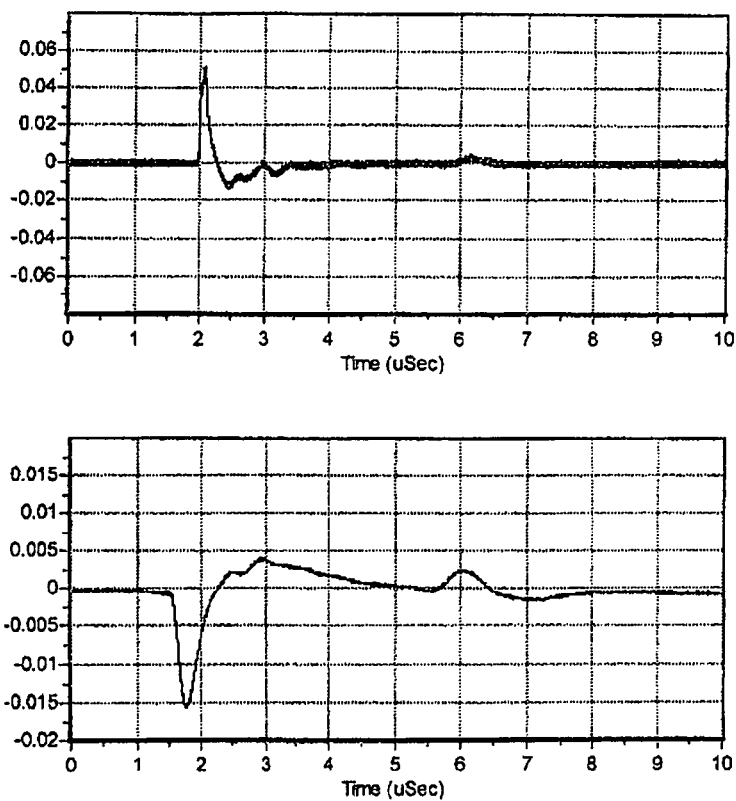
FIG. 7 shows a calibration pulse measured at a motor and at switchgear for the motor.

The pulse retention factor for a motor installation may be calculated by injecting low-voltage calibration pulses onto the stator windings of a de-energized motor and measuring this pulse at each end of the cable supplying the motor to assess the retention of charge content from stator winding to the partial discharge measurement point. FIG. 7 shows partial discharge pulses (captured at a rate of 100 MS/s) measured at each end of the cable during such a test. The upper graph shows the pulse measured at the motor, and the lower graph shows the pulse measured at motor switchgear, located at the end of the motor cable remote from the motor.

The table below provides pulse retention factor values for each phase of two test motor installations obtained by direct calibration pulse injection, and also calculated from partial discharge measurements carried out at the switchgear and motor ends of the motor cable. This calibration test resulted in a pulse retention factor of 0.45 which was in close agreement to the pulse retention factor (0.50) calculated from actual partial discharge pulse waveforms. Calibration pulse injections are useful in order to take into account pulse attenuation and provide for reliable, remote partial discharge monitoring of the remote motor or other HV plant item.

An appropriate pulse retention factor is then applied in order to correct the measured magnitude of detected pulses. Other characteristics of detected pulses can also be calculated, such as absolute peak, average peak, average partial discharge and cumulative partial discharge, and appropriate pulse retention factors may be applied to correct these values.

This analysis is repeated for all data segments extracted from a power cycle block, and continues for each subsequent block.

The outcome of data analysis by the computer is shown via a graphical user interface 13 as well as stored for future use. The computer may be caused to display details of pulses which have been classified as originating from the motor 1, or at least all pulses that have not been classified as originating from elsewhere than the motor. These pulses may be further classified as being caused by phase to phase or phase to earth events. For any identified pulses the computer may be caused to provide selected data regarding the pulses, including absolute peak, average peak, average partial discharge and cumulative partial discharge activity.

The computer may be arranged to generate an alarm signal in the event that a partial discharge event meeting certain predetermined criteria is met, for example where the magnitude of a particular class of partial discharge event exceeds a predetermined value. Data and/or alarm signals may be transmitted to and/or received from a remote location via the internet or SCADA interface.

Figure 8:
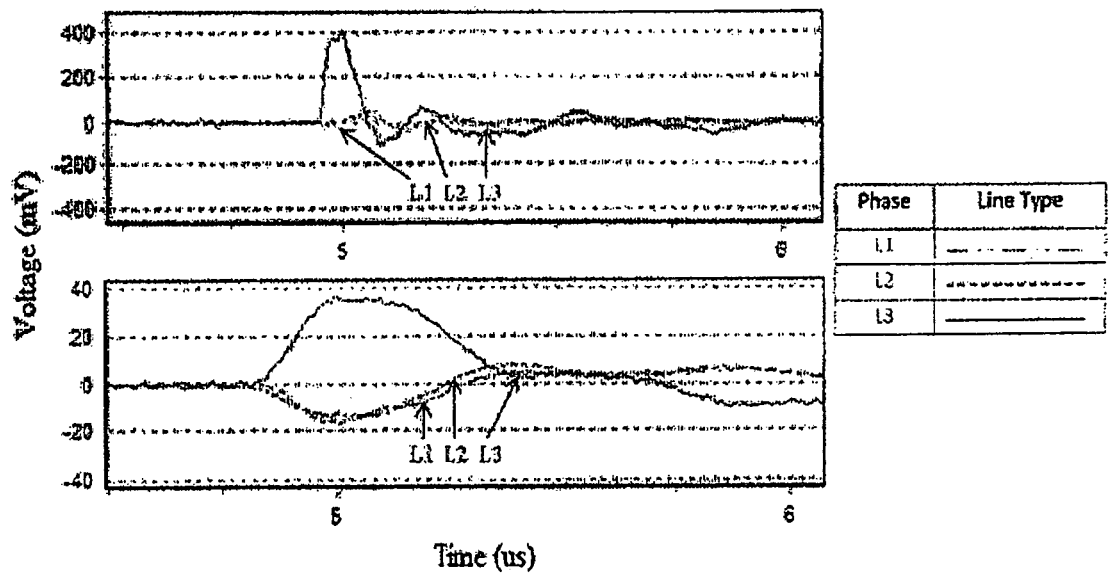
FIG. 8 shows partial discharge pulses caused by a phase to earth partial discharge event measured at a motor and at switchgear for the motor.

Apparatus according to the invention was employed to monitor a 10 kV, 800 kW four-pole induction motor, along a 350 m PVC insulated cable. FIG. 8 shows pulse parameters for partial discharge pulses generated by a phase-to-earth partial discharge event at the motor, as measured by the apparatus position at the end of the cable remote from the motor near to its switchgear (lower graph), and by similar apparatus positioned at the other end of the cable near to the motor (upper graph). Computed characteristics of the partial discharge pulses are as shown in the following table:

| Parameter of partial discharge | Motor-End partial discharge Measurements Phase | | | Switchgear-End partial discharge Measurements Phase | | |
| --- | --- | --- | --- | --- | --- | --- |
| Pulse | L1 | L2 | L3 | L1 | L2 | L3 |
| Rise Time (ns) | 29.4 | 49.2 | 58.3 | 150.5 | 122.4 | 166.9 |
| Fall Time (ns) | 59.6 | 54.8 | 47.7 | 192.2 | 322.3 | 306.7 |
| Pulse Width (ns) | 90 | 100 | 100 | 340 | 470 | 480 |
| Charge (nC) | 3.84 | 5.18 | 10.93 | 2.56 | 3.79 | 5.03 |
| Amplitude (mV) | 25.6 | 57.6 | 409.6 | 26.9 | 24.6 | 54.4 |

By comparing the pulse wave-shape measurements made at each end of the cable, the effects of attenuation and dispersion of the pulses as they travel along the cable can be

| Pulse retention factor Phase-to-Earth | | | | Pulse retention factor Phase-to-Phase | | | |
| --- | --- | --- | --- | --- | --- | --- | --- |
| Ph-E Pulse Injection | L1 From partial discharge | L2 From partial discharge | L3 From partial discharge | Ph-Ph Pulse Injection | L1 From partial discharge | L2 From partial discharge | L3 From partial discharge |
| 0.45 | 0.66 | 0.73 | 0.46 | 0.58 | 0.49 | 0.40 | 0.49 | assessed. The partial discharge pulses emanating from the motor stator attenuate in magnitude and disperse in shape (pulse broadening) as they propagate along the cable. In this case all three of the pulse timing measurements (L1, L2 and L3) increase by a factor of between 2.5 and 6.4 as the pulse travels from one end of the cable to the other.

Figure 9:
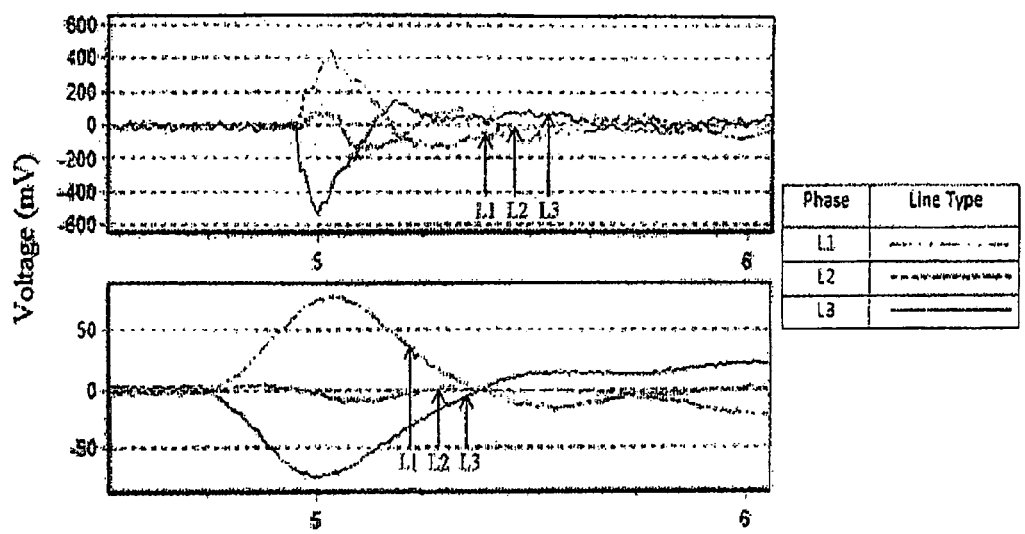
FIG. 9 shows partial discharge pulses caused by a phase to phase partial discharge event measured at a motor and at switchgear for the motor.

Apparatus according to the invention was also used to monitor a 10 kV, 2400 kW two-pole induction motor along a 350 m PVC insulated cable. FIG. 9 shows pulse parameters for partial discharge pulses generated by a phase-to-phase partial discharge event at the motor, as measured by the apparatus position at the end of the cable remote from the motor, near to its switchgear (lower graph), and by similar apparatus positioned at the other end of the cable near to the motor (upper graph). Each set of apparatus computed characteristics of the partial discharge pulses, as shown in the following table:

| Parameter of partial discharge | Machine-End partial discharge Measurements Phase | | | Switchgear-End partial discharge Measurements Phase | | |
|---|---|---|---|---|---|---|
| Pulse | L1 | L2 | L3 | L1 | L2 | L3 |
| Rise Time (ns) | 88.2 | 24.9 | 50.4 | 198.3 | 214.8 | 192.5 |
| Fall Time (ns) | 95.6 | 74.6 | 88.2 | 291.0 | 285.4 | 278.3 |
| Pulse Width (ns) | 190 | 100 | 150 | 580 | 550 | 510 |
| Charge (nC) | 20.48 | 3.97 | 19.65 | 10.05 | 1.62 | 9.66 |
| Amplitude (mV) | 415.98 | 160.0 | 543.98 | 72.96 | 11.52 | 73.60 |

By comparing the pulse wave-shape measurements made at each end of the cable, the effects of attenuation and dispersion of the pulses as they travel along the cable feeder can be assessed. The partial discharge pulses emanating from the motor stator attenuate in magnitude and disperse in shape (pulse broadening). In this case all three of the pulse timing measurements increase by a factor of between 2.25 and 8.6 as the pulse travels from one end of the cable to the other.

Figure 10:
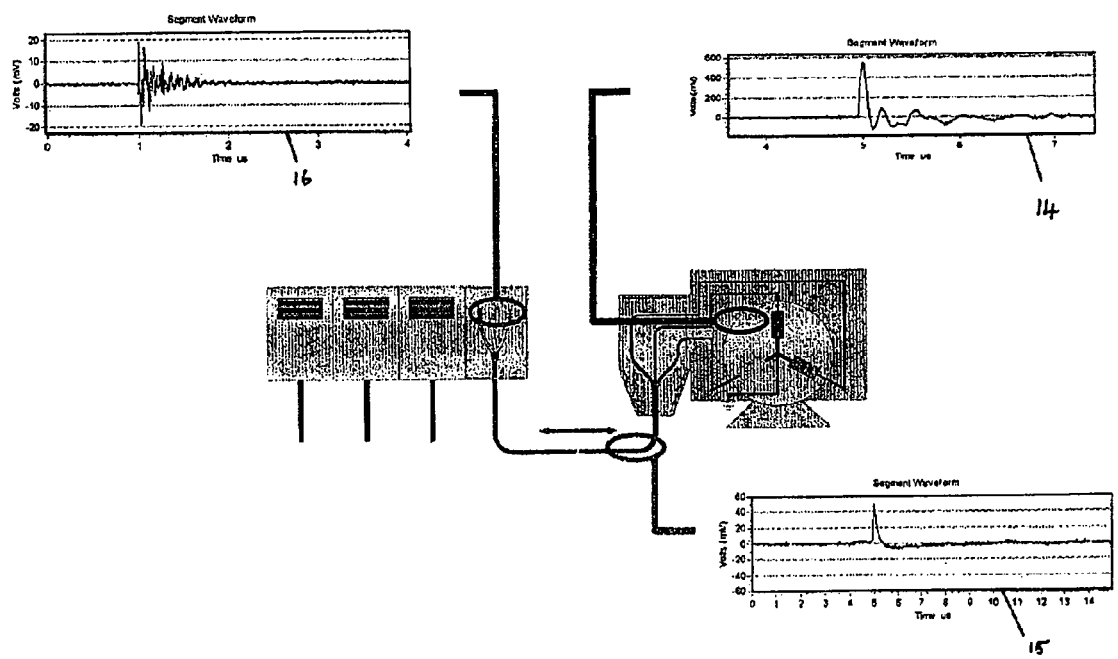
FIG. 10 is a schematic view of an electrical installation with example partial discharge pulses.

FIG. 10 illustrates data segments for partial discharge pulses originating from the motor 14, the cable 15 and the switchgear 16. The different pulse shapes are characteristic of partial discharge events in the motor, cable and switchgear and so analysis of the shape is able to discriminate between pulses from these sources.

The invention confers key advantages over existing techniques for measuring partial discharge events in machines. Being able to monitor partial discharge events remotely, via a power cable, avoids the need for partial discharge monitoring equipment to be mounted on the machine. This reduces complexity of an installation, the amount of equipment required to monitor multiple machines and importantly means that the partial discharge monitoring equipment need not be cleared for use in Ex environments where the machine to be monitored is located in such an environment. Using a multiplexer enables multiple machines to be monitored using a single digitiser and computer.

The above embodiment is described by way of example only. Many variations are possible without departing from the scope of the invention as defined in the appended claims.

The invention claimed is:

1. Monitoring apparatus for remote monitoring of partial discharge events in electrical apparatus, the monitoring apparatus comprising: one or more sensors for detecting, at a position remote from the electrical apparatus being monitored, partial discharge pulses in one or more conductors conveying electrical power to the electrical apparatus being monitored and means for discriminating arranged to analyse pulse shape and to discriminate between the detected pulses according to their pulse shapes in order to determine whether each of the detected partial discharge pulses originated from the electrical apparatus being monitored or from other causes, wherein the monitoring apparatus further comprises one or more additional partial discharge sensors arranged to detect only those partial discharge pulses that do not originate from the electrical apparatus being monitored, and wherein the means for discriminating is arranged to compare the output of the or each said sensor with that of the or each said additional sensor, and thereby to determine whether pulses detected in the one or more conductors originated from the electrical apparatus being monitored or from other causes.

2. Apparatus as claimed in claim 1 wherein the means for discriminating comprises a digitiser arranged to receive data from the or each sensor on a separate channel and to digitise the data into data blocks spanning the duration of at least one cycle of alternating current supplied to the electrical apparatus in the or each electrical conductor, and comprising data from the or each channel over that duration.

3. Monitoring apparatus as claimed in claim 2 wherein the means for discriminating is arranged to scan each data block to detect partial discharge pulses, and to store a data segment comprising the output of each channel for each detected partial discharge event, the duration of the data segment being chosen so that only the detected partial discharge pulse is included in the channel on which the pulse was detected.

4. Monitoring apparatus as claimed in claim 2 wherein the means for discriminating is arranged to scan each data block to detect partial discharge pulses, and to store a data segment comprising the output of each channel for each detected partial discharge event, the duration of the data segment being chosen to be at least the time taken for a pulse to propagate along the or each conductor between the sensor(s) and the electrical apparatus being monitored, and back.

5. Monitoring apparatus as claimed in claim 1 wherein the or each additional sensor is a transient earth voltage sensor.

6. Monitoring apparatus as claimed in claim 1 comprising two or more said sensors for detecting partial discharge pulses in two or more respective conductors conveying electrical power to the electrical apparatus to be monitored and wherein the means for discriminating is arranged to compare measurements made by each sensor thereby to determine the cause of a measured partial discharge event.

7. Monitoring apparatus as claimed in claim 6 wherein the means for discriminating is arranged to classify a partial discharge event as phase-to-phase when an event is measured substantially simultaneously and with a similar magnitude by two or more sensors and as phase-to-earth when one sensor measures the event with significantly greater magnitude than the other sensor or sensors.

8. Monitoring apparatus as claimed in claim 1 wherein the means for discriminating is arranged to measure any or all of: rise time, fall time, width, frequency content, magnitude, polarity and number of oscillations of detected partial discharge pulses.

9. Monitoring apparatus as claimed in claim 1 wherein the means for discriminating is arranged to measure any or all of: charge content, absolute peak, average peak, average partial discharge and cumulative partial discharge of detected partial discharge pulses.

10. Monitoring apparatus as claimed in claim 9 wherein the monitoring apparatus further comprises means for applying a respective pulse retention factor to the or each measured parameter in order to determine an approximate value for the parameter at the electrical apparatus being monitored rather than at the point of measurement.

11. Monitoring apparatus as claimed in claim 1 wherein the means for discriminating is arranged to identify reflected pulses detected in the or each conductor, to measure the time elapsed between detecting of the original pulse and reflected pulse and to compare the measured time elapsed between initial and reflected pulses with a stored value, thereby to determine if detected discharge pulses originate from the electrical apparatus being monitored or another cause.

12. Monitoring apparatus as claimed in claim 11 wherein the stored value is equal to, or greater than, the time taken for a pulse to propagate along the or each conductor between the sensor(s) and the electrical apparatus being monitored, and back.

13. An installation comprising electrical apparatus to be monitored, at least one conductor connected to the electrical apparatus to be monitored for conveying electrical power thereto, and monitoring apparatus according to claim 1 mounted to the or each conductor, remote from the electrical apparatus to be monitored.

14. An installation as claimed in claim 13 wherein the monitoring apparatus is mounted at least 50 m from the electrical apparatus to be monitored.

15. An installation as claimed in claim 13 wherein the or each conductor runs from the electrical apparatus to switchgear for controlling the electrical apparatus and the monitoring apparatus is mounted in or adjacent the switchgear.

16. An installation as claimed in claim 15, wherein the or each additional sensor is associated with the switchgear.

17. An installation as claimed in claim 13 wherein the or each conductor is comprised in cable.

18. An installation as claimed in claim 13 wherein there are three conductors, for conducting a three phase electrical supply, and the monitoring apparatus comprises three sensors, a respective sensor monitoring each conductor.

19. An installation as claimed in claim 13 wherein the electrical apparatus to be monitored is located in an explosion risk environment, and the monitoring apparatus is located outside the explosion risk environment.

20. A method of monitoring partial discharge events in electrical apparatus, the method comprising the steps of mounting, at a position remote from the apparatus, one or more sensors for detecting partial discharge pulses in a conductor supplying electrical power to the apparatus; detecting partial discharge pulses; and analysing the shape of the detected pulses in order to discriminate between partial discharge pulses originating from the apparatus and pulses originating from other causes, wherein the method comprises the further steps of providing one or more additional partial discharge sensors arranged to detect only pulses that do not originate from the apparatus and comparing the output of the one or more sensors with that of the one or more additional sensors thereby to determine whether partial discharge pulses detected by the one or more sensors originate from the apparatus or from local to the sensor(s).

21. A method as claimed in claim 20 wherein the or each sensor is mounted at least 50 m from the apparatus.

22. A method as claimed in claim 20 wherein the or each additional sensor is a transient earth voltage sensor.

23. A method as claimed in claim 20 comprising the step of calculating the charge content of detected partial discharge pulses.

24. A method as claimed in claim 23 comprising the step of applying a factor to the measured charge content in order to determine the approximate charge content of the pulse at its origin.

25. A method as claimed in claim 20 comprising the step of simultaneously monitoring two or more conductors and comparing time of occurrence of partial discharge charge pulses in each conductor thereby to determine the cause of the partial discharge pulses.

26. Monitoring apparatus as claimed in claim 1 wherein the means for discriminating is arranged to classify a partial discharge event as not originating from the electrical apparatus being monitored when the event is detected by the or at least one said additional sensor.

27. Monitoring apparatus as claimed in claim 1 wherein the means for discriminating is arranged to classify a partial discharge event as not originating from the electrical apparatus being monitored when the event is detected substantially simultaneously by the or at least one said sensor and by the or at least one said additional sensor.

28. Monitoring apparatus as claimed in claim 4 wherein the means for discriminating is arranged to classify a partial discharge event as neither phase-to-phase nor phase-to-earth when the event is detected by the or at least one said additional sensor.

29. Monitoring apparatus as claimed in claim 4 wherein the means for discriminating is arranged to classify a partial discharge event as neither phase-to-phase nor phase-to-earth when the event is detected substantially simultaneously by one or more of the sensors and by the or at least one said additional sensor.

* * * * *